(12) United States Patent
Chen et al.

(10) Patent No.: US 7,825,681 B2
(45) Date of Patent: Nov. 2, 2010

(54) COMMON MODULES FOR DDRII SDRAM AND DDRIII SDRAM

(75) Inventors: Chin-Hui Chen, Taipei Hsien (TW); Hou-Yuan Lin, Taipei Hsien (TW)

(73) Assignee: Giga-Byte Technology Co., Taipei (TW)

( * ) Notice: Subject to any disclaimer, the term of this patent is extended or adjusted under 35 U.S.C. 154(b) by 707 days.

(21) Appl. No.: 11/819,114

(22) Filed: Jun. 25, 2007

(65) Prior Publication Data

US 2008/0316220 A1 Dec. 25, 2008

(51) Int. Cl.
*H03K 17/16* (2006.01)
*H03K 19/003* (2006.01)

(52) U.S. Cl. .............................. 326/30; 326/32; 326/33
(58) Field of Classification Search .................. 326/30, 326/32–34
See application file for complete search history.

(56) References Cited

U.S. PATENT DOCUMENTS

| | | | |
|---|---|---|---|
| 5,706,447 A * | 1/1998 | Vivio | ........................... 362/30 |
| 6,466,472 B1 | 10/2002 | Lin | |
| 6,665,736 B1 * | 12/2003 | Fan | ................ 710/2 |
| 2002/0144166 A1 * | 10/2002 | Chang et al. | ................ 713/320 |
| 2006/0077731 A1 | 4/2006 | Ware et al. | |
| 2006/0262587 A1 | 11/2006 | Matsui et al. | |
| 2007/0126466 A1 * | 6/2007 | Kim | ............................ 326/30 |

* cited by examiner

*Primary Examiner*—Don P Le
*Assistant Examiner*—Anh Q. Tran
(74) *Attorney, Agent, or Firm*—Birch, Stewart, Kolasch & Birch, LLP

(57) ABSTRACT

A common module for a double data rate-synchronous II synchronous dynamic random access memory (DDRII SDRAM) and a DDRIII SDRAM applied in a computer is provided. The common module includes a first bus, a termination circuit card, a first slot, and a second slot. The first bus transmits a plurality of signals. The termination circuit card comprises a plurality of termination resistors. The first slot is disposed on the common module and coupled to the first bus. The DDRII SDRAM is installed in the first slot. The second slot is disposed on the common module and coupled to the first bus. The DDRIII SDRAM or the termination circuit card is installed in the second slot. When the DDRII SDRAM is installed in the first slot, the termination circuit card is installed in the second slot.

13 Claims, 15 Drawing Sheets

COMMON MODULES FOR DDRII SDRAM AND DDRIII SDRAM

CROSS REFERENCE TO RELATED APPLICATIONS

This application claims the benefit of Taiwan application Serial No. 96117224 filed May 15, 2007, the subject matter of which is incorporated herein by reference.

BACKGROUND OF THE INVENTION

1. Field of the Invention

The invention relates to a common module, and more particularly to a common module for a double data rate-synchronous II synchronous dynamic random access memory (DDRII SDRAM) and a DDRIII SDRAM.

2. Description of the Related Art

Double data rate-synchronous III synchronous dynamic random access memories (DDRIII SDRAMs) have been developed to meet the requirements of high transfer rate and low power consumption. The operating voltage of a DDRIII SDRAM has been reduced over the previous generation from 2.5V to 1.8V, thus, power consumption has been correspondingly reduced, resulting in longer operating life of application devices (such as computers and mobile phones). Additionally, the DDRIII SDRAM packaging techniques, pins, and signals have also improved over previous generations.

FIG. 1 shows a conventional main board of a DDRII SDRAM. In FIG. 1, a DDRII SDRAM 11 is installed in a DDRII slot of a main board 1. A main controller 10 provides data signals DATA, address signals ADD, and control signals CMD to the DDRII SDRAM 11. The main controller 10 can be an Intel north bridge chipset or an AMD central processing unit (CPU). Referring to FIG. 1, termination resistors $R_{ADD}$ and $R_{CMD}$ required for the address signals ADD and the control signals CMD are disposed on the main board 1, and termination resistors $R_{DATA}$ for the data signals DATA are built into the DDRII SDRAM 11.

FIG. 2 shows a conventional main board of a DDRIII SDRAM. In FIG. 2, a DDRIII SDRAM 21 is installed in a DDRIII slot of a main board 2. A main controller 20 provides data signals DATA, address signals ADD, and control signals CMD to the DDRIII SDRAM 21. The main controller 20 can be an Intel north bridge chipset or an AMD CPU. Referring to FIG. 2, termination resistors $R_{DATA}$, $R_{ADD}$, and $R_{CMD}$ required for the data signals DATA, the address signals ADD, and the control signals CMD are built into the DDRIII SDRAM 21. Compared with the main board 1 of the DDRII SDRAM 11 in FIG. 1, the termination resistors $R_{ADD}$ and $R_{CMD}$ of the DDRIII SDRAM 21 are removed from the main board 2 and disposed inside the DDRIII SDRAM 21.

As described, the specifications of a DDRII SDRAM and a DDRIII SDRAM are different. When a DDRII SDRAM or a DDRIII SDRAM is used selectively, a different main board is required for each.

A common module for a DDRII SDRAM and a DDRIII SDRAM is thus provided. The common module allows selective use of a DDRII SDRAM or a DDRIII SDRAM without requiring two main boards having different specifications.

BRIEF SUMMARY OF THE INVENTION

An exemplary embodiment of a common module for a double data rate-synchronous II synchronous dynamic random access memory (DDRII SDRAM) and a DDRIII SDRAM, is applied in a computer and comprises a first bus, a termination circuit card, a first slot, and a second slot. The first bus transmits a plurality of signals. The termination circuit card comprises a plurality of termination resistors. The first slot is disposed on the common module and coupled to the first bus. The DDRII SDRAM is selectively installed in the first slot. The second slot is disposed on the common module and coupled to the first bus. The DDRIII SDRAM or the termination circuit card is installed in the second slot. When the DDRII SDRAM is installed in the first slot, the termination circuit card is installed in the second slot.

An exemplary embodiment of a common module for a double data rate-synchronous II synchronous dynamic random access memory (DDRII SDRAM) and a DDRIII SDRAM, is applied in a computer and comprises a first bus, a first slot, a second slot, a plurality of termination resistors, and a plurality of switches. The first bus transmits a plurality of signals. The first slot is disposed on the common module and coupled to the first bus. The second slot is disposed on the common module and coupled to the first bus. The switches are correspondingly coupled between the termination resistors and the first bus. In a first mode, the DDRII SDRAM is installed in the first slot, and the switches are turned on to couple the termination resistors to the first bus. In the second mode, the DDRIII SDRAM is installed in the second slot, and the switches are turned off.

An exemplary embodiment of a common module for a double data rate-synchronous II synchronous dynamic random access memory (DDRII SDRAM) and a DDRIII SDRAM, is applied in a computer and comprises a first bus, a first slot, a second slot, and a plurality of termination resistors. The first bus transmits a plurality of signals. The first slot is disposed on the common module and coupled to the first bus. The DDRII SDRAM is selectively installed in the first slot. The second slot is disposed on the common module and coupled to the first bus. The DDRIII SDRAM is selectively installed in the second slot. The termination resistors correspondingly coupled are correspondingly coupled to the first bus.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 4b shows the termination circuit card of FIG. 3a;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
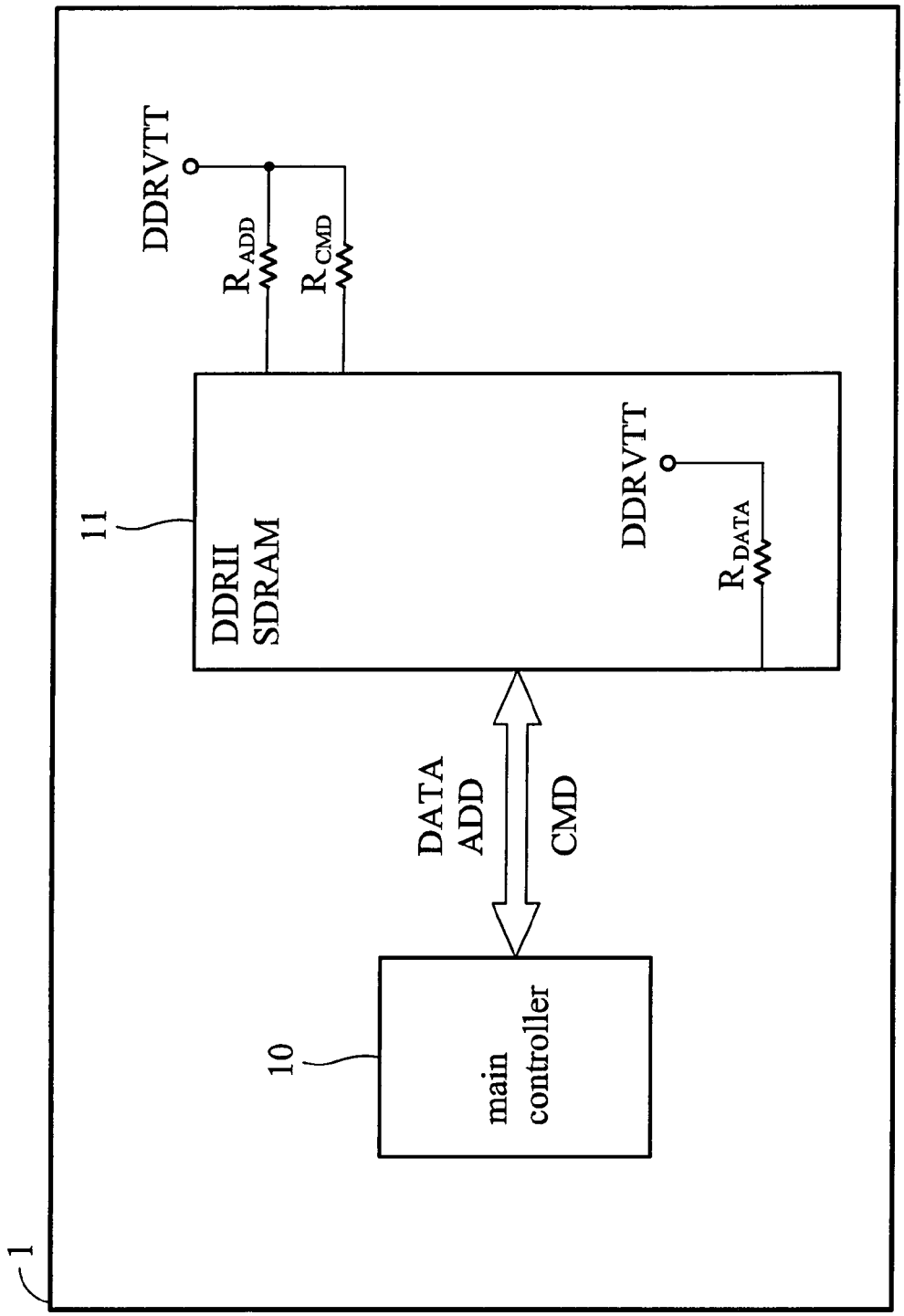
FIG. 1 shows a conventional main board of a DDRII SDRAM.
Figure 2:
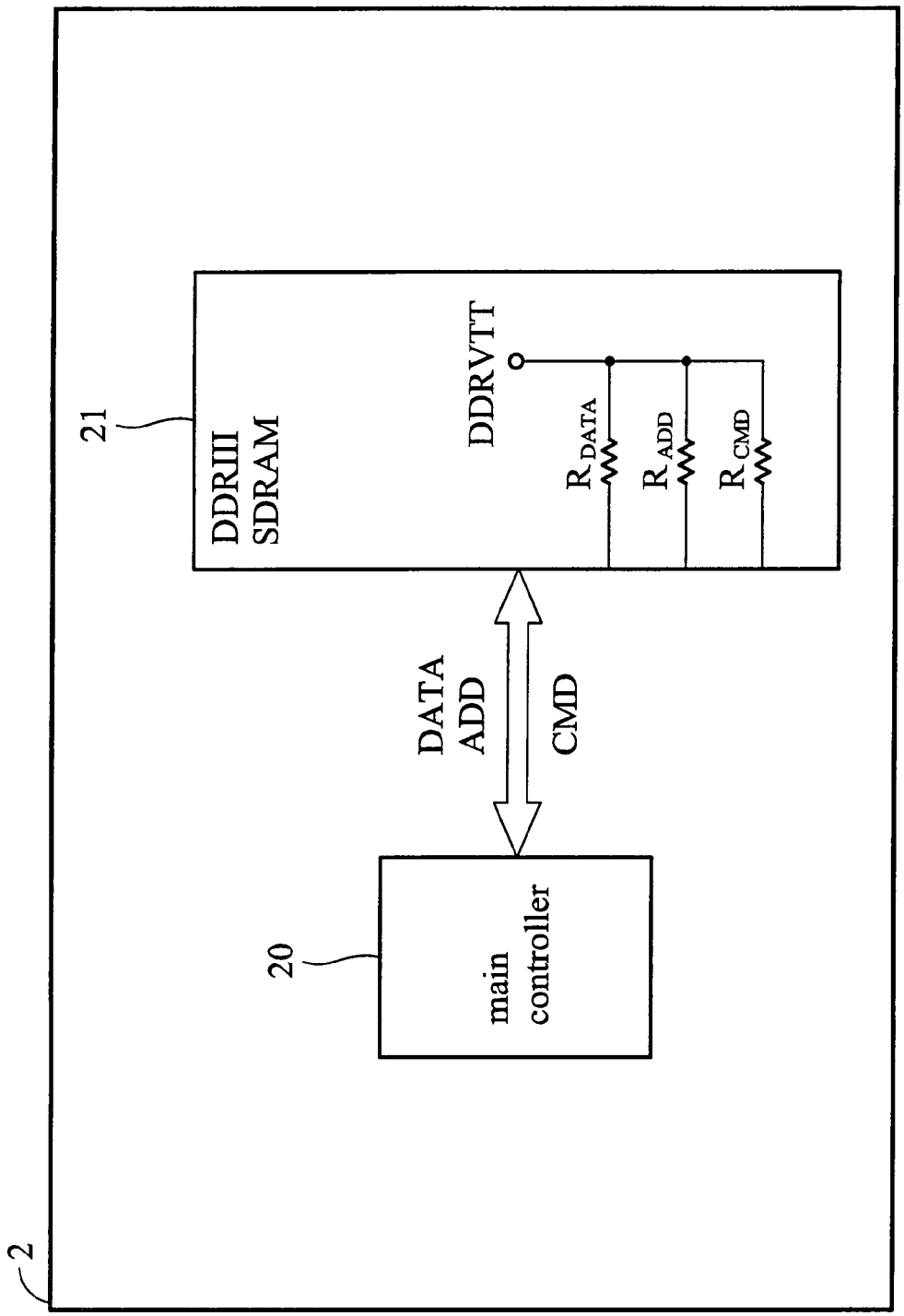
FIG. 2 shows a conventional main board of a DDRIII SDRAM.
Figure 3A:
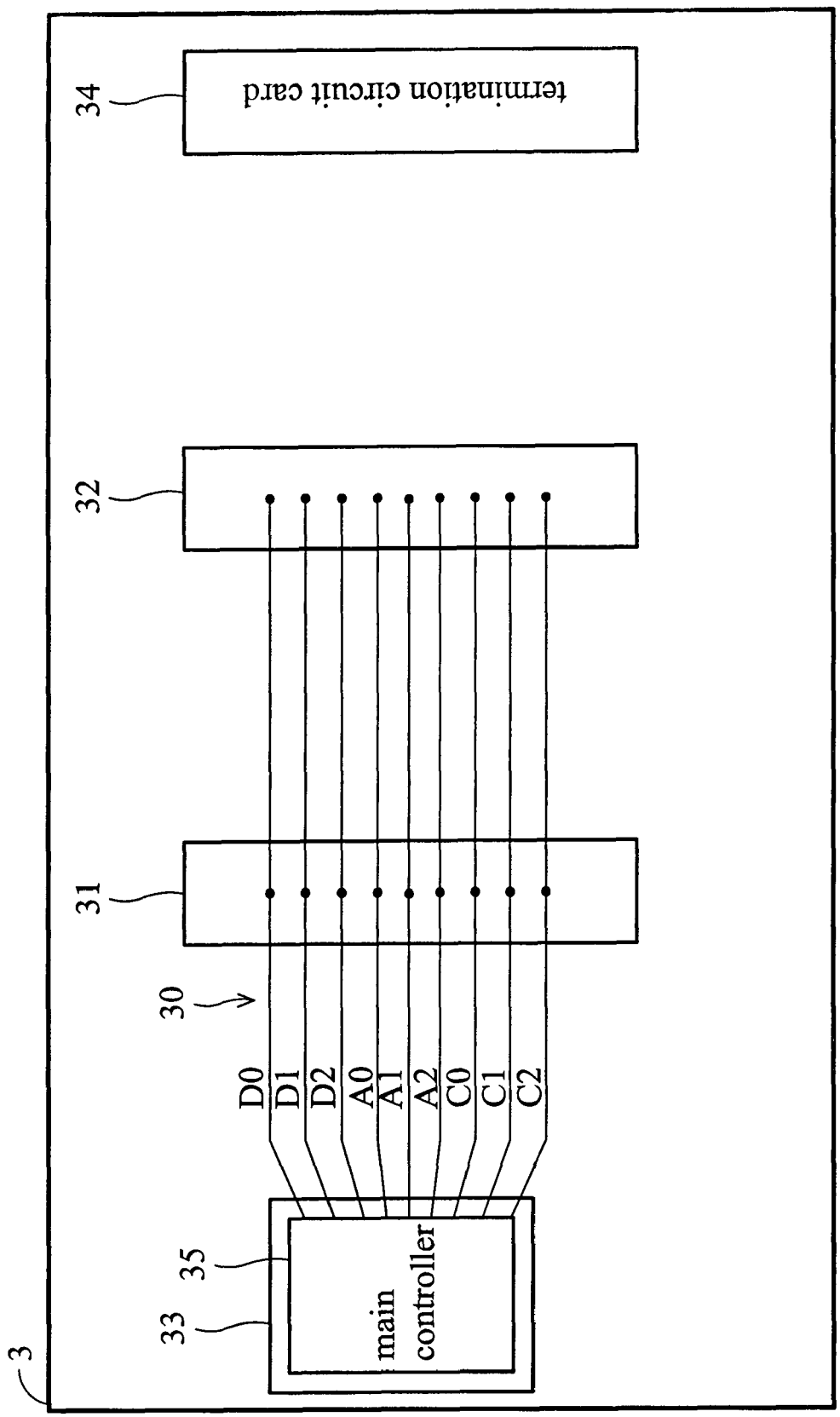
FIGS. 3a and 3b show an exemplary embodiment of a common module for a DDRII SDRAM and a DDRIII SDRAM.

Common modules for a double data rate-synchronous II synchronous dynamic random access memory (DDRII SDRAM) and a DDRIII SDRAM are provided. In an exemplary embodiment of a common module for a DDRII SDRAM and a DDRIII SDRAM in FIG. 3a, a common module 3 is applied in a computer system and comprises a first bus 30, at least one first slot 31, a second slot 32, a third slot 33, and a termination circuit card 34. Note that the termination circuit card 34 is not fixed in the position represented in FIG. 3a, and the position of the termination circuit card 34 indicates that the termination circuit card 34 is included in the common module 3. The first to third slots 31-33 are disposed on the common module 3 and coupled to the first bus 30. A main controller 35 of the computer system is installed in the third slot 33.

Figure 3B:
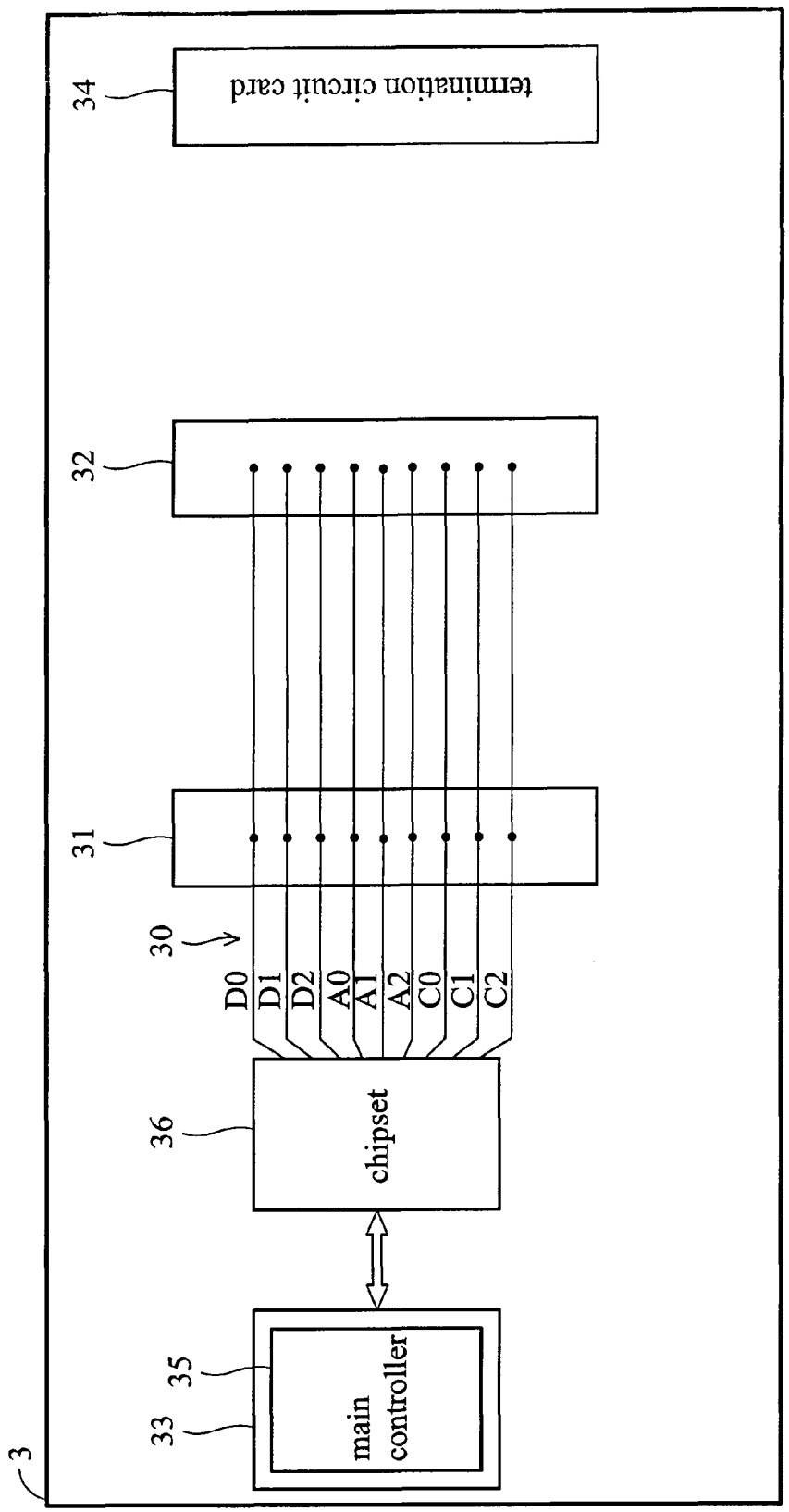

The main controller 35 provides a plurality of signals to the first bus 30. In some embodiments, the main controller 35 is an AMD CPU. In some embodiments, as shown in FIG. 3b, the common module 3 further comprises a chipset 36 coupled to the main controller 35, and the chipset 36 transmits signals from the main controller 35 to the first bus 30. In the embodiment of FIG. 3b, the main controller 35 is an Intel CPU, and the chipset 36 is implemented by a north bridge chipset.

The signals from the main controller 35 comprise data signals, address signals, and control signals. In the following description, data signals D0-D2, address signals A0-A2, and control signals C0-C2 are given as an example.

The common module 3 operates in two modes, the first is DDRII SDRAM mode, and the second is DDRIII SDRAM mode.

Figure 4A:
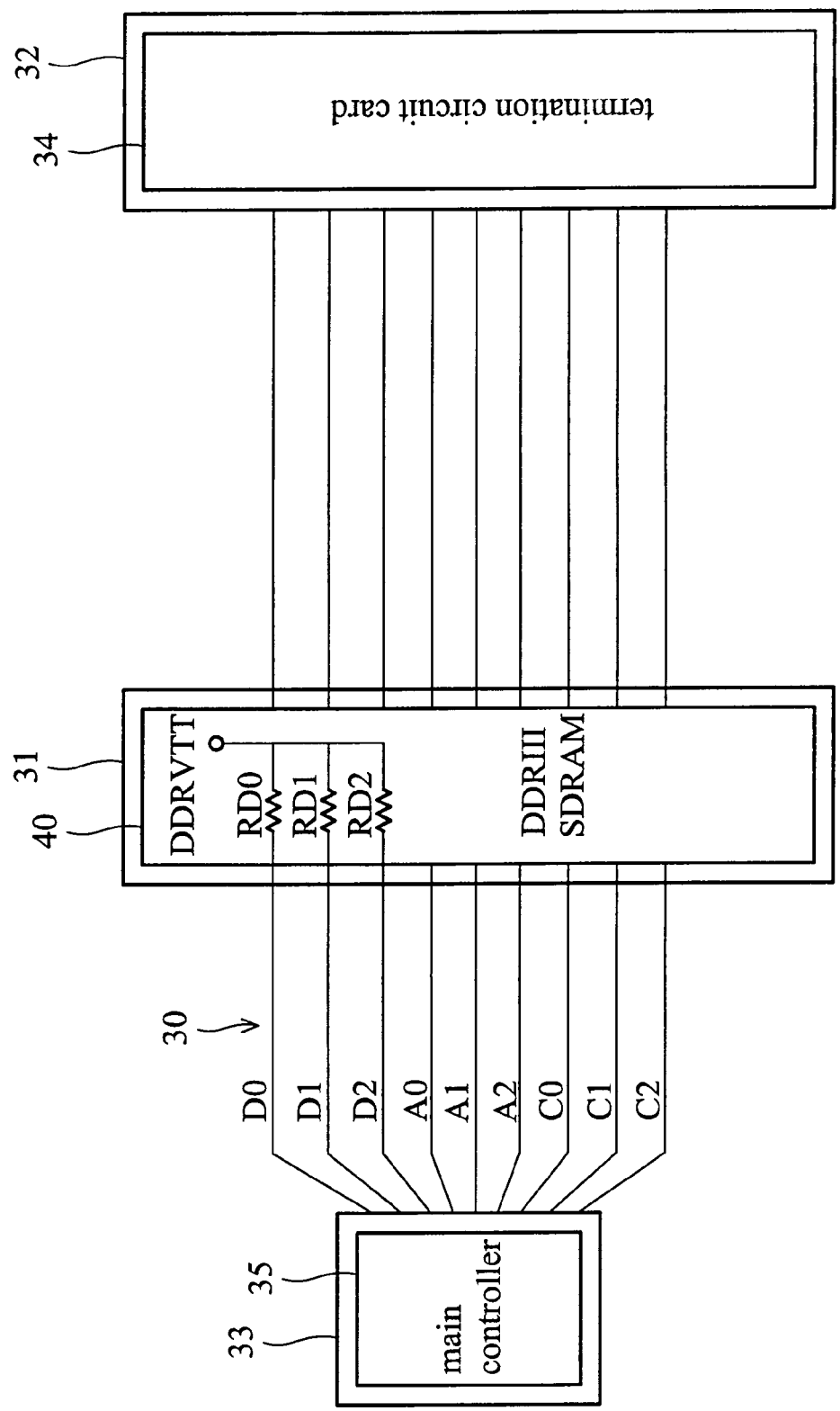
FIG. 4a shows the common module of FIG. 3a in the first mode.
Figure 4B:
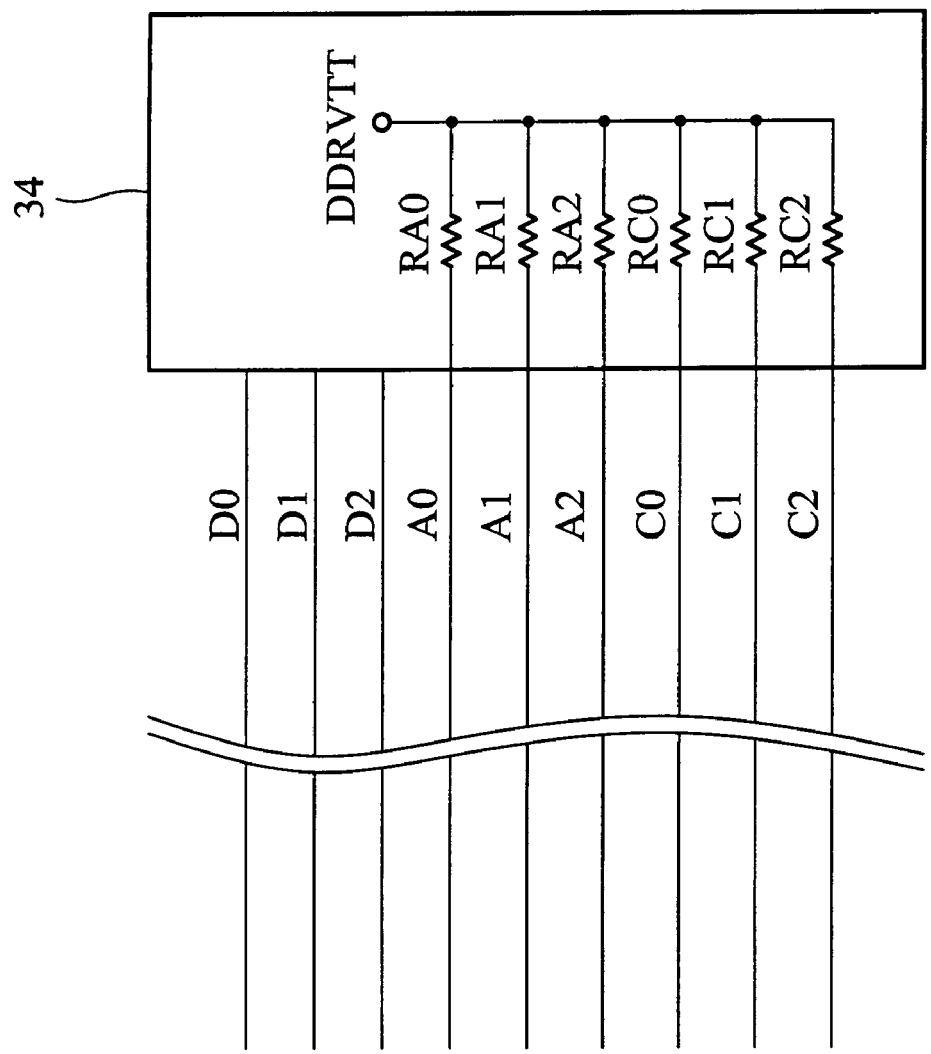

FIG. 4a shows the common module 3 in the first mode. Referring to FIG. 4a, in the first mode, a DDRII SDRAM 40 is installed in the first slot 31, and the termination circuit card 34 is installed in the second slot 32. Referring to FIG. 4b, the termination circuit card 34 comprises a plurality of termination resistors R, and the termination resistors R match the address signals A0-A2 and the control signals C0-C2 in impedance. For example, termination resistors RA0-RA2 respectively match the address signals A0-A2, and termination resistors RC0-RC2 respectively match the control signals C0-C2. Termination resistors matching the data signals D0-D2 are built into the DDRII SDRAM 40. When the termination circuit card 34 is installed in the second slot 32, the termination resistors RA0-RA2 and RC0-RC2 are correspondingly coupled to the first bus 30, thus, the termination resistors RA0-RA2 coupled the address signals A0-A2 respectively, and the termination resistors couple the RC0-RC2 control signals C0-C2 respectively.

Figure 5:
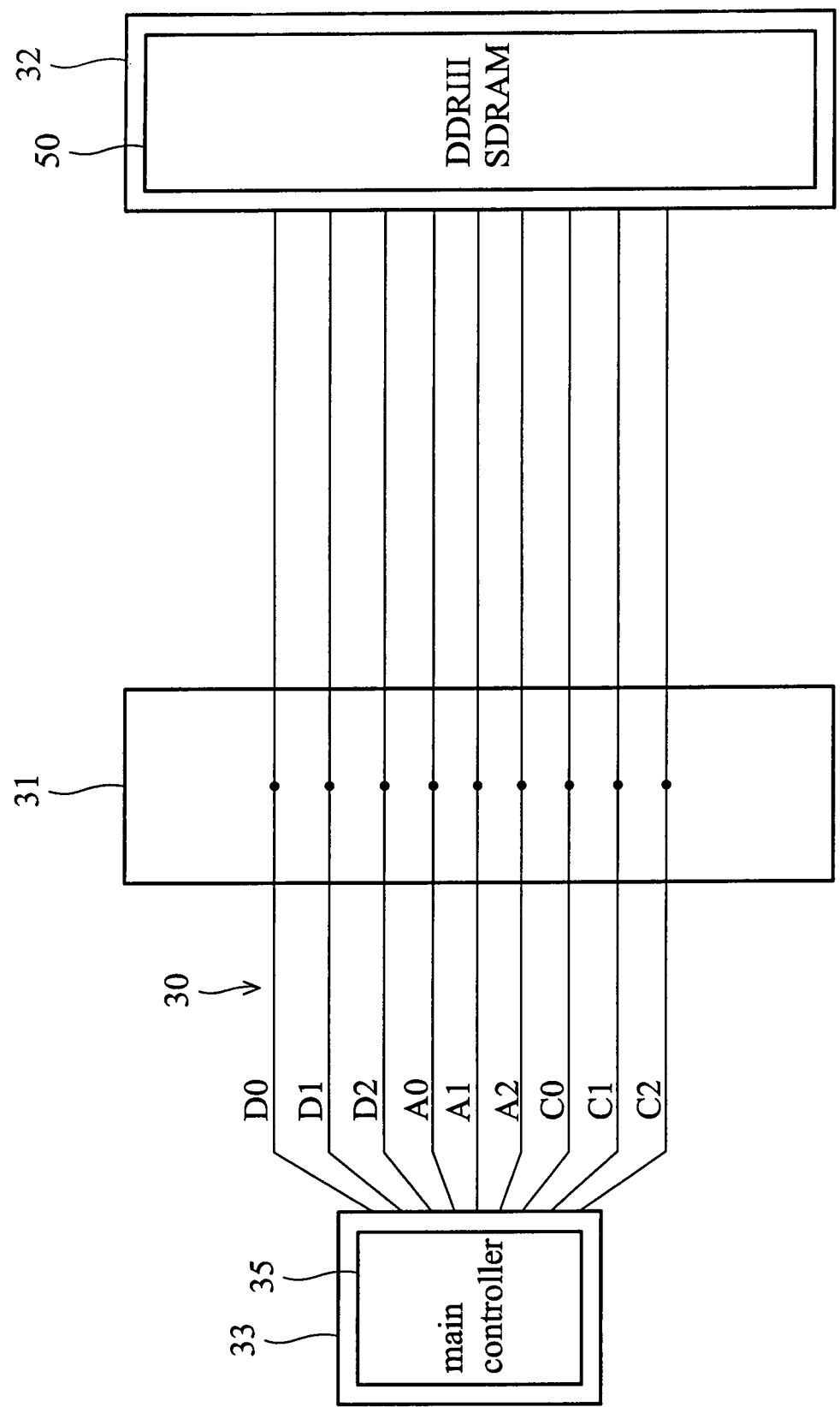
FIG. 5 shows the common module of FIG. 3a in the second mode.

FIG. 5 shows the common module 3 in the second mode. Referring to FIG. 5, in the second mode, the DDRII SDRAM 40 is removed from the first slot 31, and the termination circuit card 24 is removed from the second slot 32. The DDRIII SDRAM 50 is installed in the second slot 32. According to the specification of the DDRIII SDRAM 50, termination resistors for the data signals D0-D2, the address signals A0-A2, and the control signals C0-C2 are built into the DDRIII SDRAM 50, and the termination circuit card 34 is no longer required.

According to the embodiment of FIGS. 3a-5, the DDRII SDRAM 40 and the termination circuit card 34 are installed when DDRII SDRAM 40 is used, and the DDRIII DRAM 50 is installed when the DDRIII SDRAM 50 is used, thus, two main boards with different specifications are not required.

Additionally, in the embodiment of FIGS. 3a-5, one first slot 31 is given as an example. In practice, the common module 3 may comprise a plurality of serially coupled first slots 31. In the first mode, one DDRII SDRAM is installed in one first slot 31.

Figure 6A:
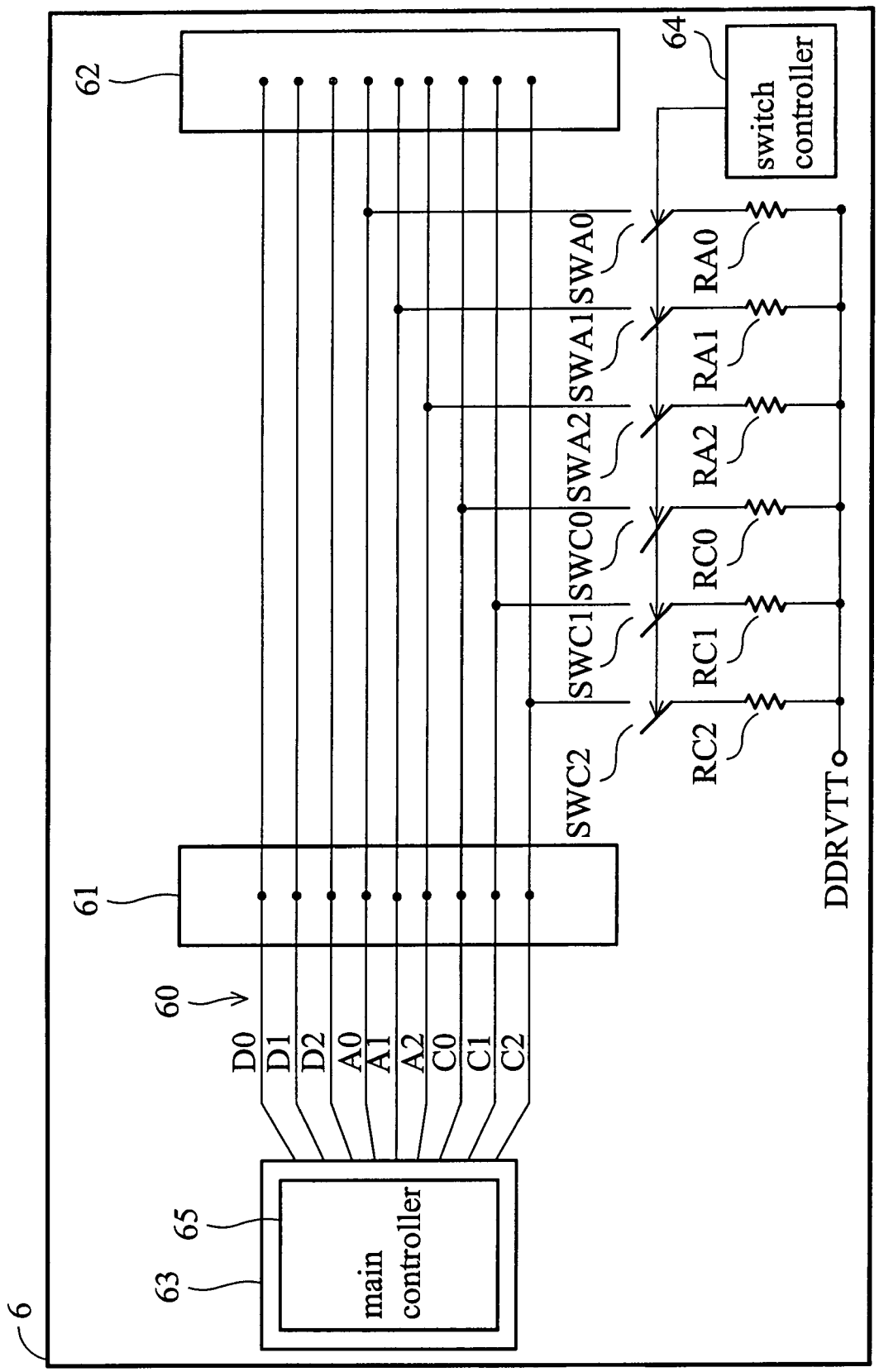
FIGS. 6a and 6b show an exemplary embodiment of a common module for a DDRII SDRAM and a DDRIII SDRAM.

In an exemplary embodiment of a common module for a DDRII SDRAM and a DDRIII SDRAM in FIG. 6a, a common module 6 is applied in a computer system and comprises a first bus 60, at least one first slot 61, a second slot 62, a third slot 63, a plurality of termination resistors R, a plurality of switches SW, and a switch controller 64. The first to third slots 61-63 are disposed on the common module 6 and coupled to the first bus 60. A main controller 65 of the computer system is installed in the third slot 63. The switches SW are coupled between the termination resistors R and the first bus 60.

Figure 6B:
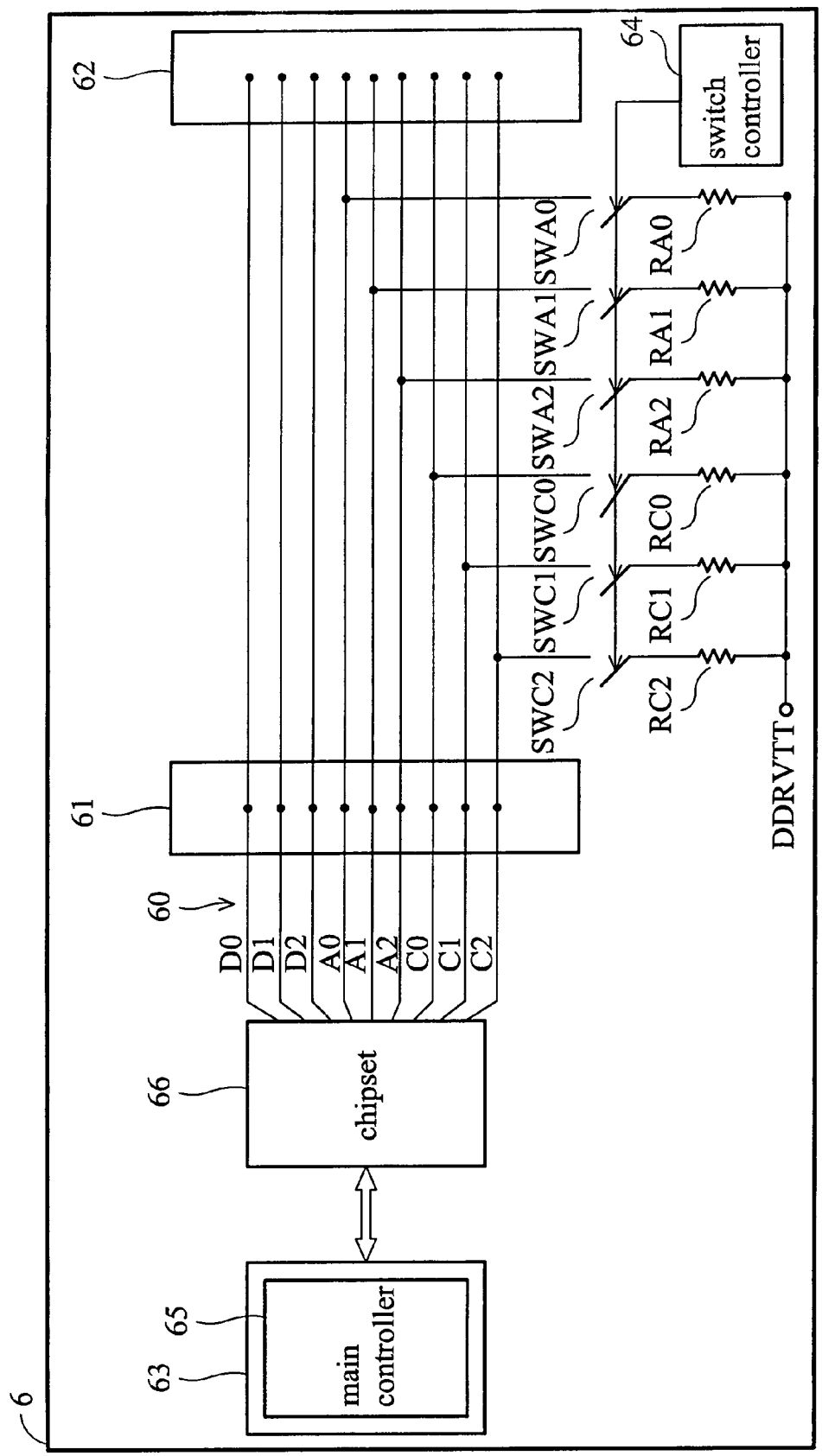

The main controller 65 provides a plurality of signals to the first bus 60. In some embodiments, the main controller 65 is an AMD CPU. In some embodiments, as shown in FIG. 6b, the common module 6 further comprises a chipset 66 coupled to the main controller 65, and the chipset 66 transmits signals from the main controller 65 to the first bus 60. In the embodiment of FIG. 6b, the main controller 65 is an Intel CPU, and the chipset 66 is implemented by a north bridge chipset.

The signals from the main controller 65 comprise data signals, address signals, and control signals. In the following description, data signals D0-D2, address signals A0-A2, and control signals C0-C2 are given as an example.

The termination resistors R match the data signals A0-A2 and the control signals C0-C2. For example, the termination resistors RA0-RA2 respectively match the address signals A0-A2, and the termination resistors RC0-RC2 respectively match the control signals C0-C2. The switches SW comprise switches SWA0-SWA2 and switches SWC0-SWC2. The switches SWA0-SWA2 are coupled between the termination resistor RA0-RA2 and the address signals A0-A2 respectively, and the switches SWC0-SWC2 are coupled between the termination resistor RC0-RC2 and the control signals C0-C2 respectively.

The common module 6 operates in two modes, the first is DDRII SDRAM mode, and the second is DDRIII SDRAM mode.

Figure 7:
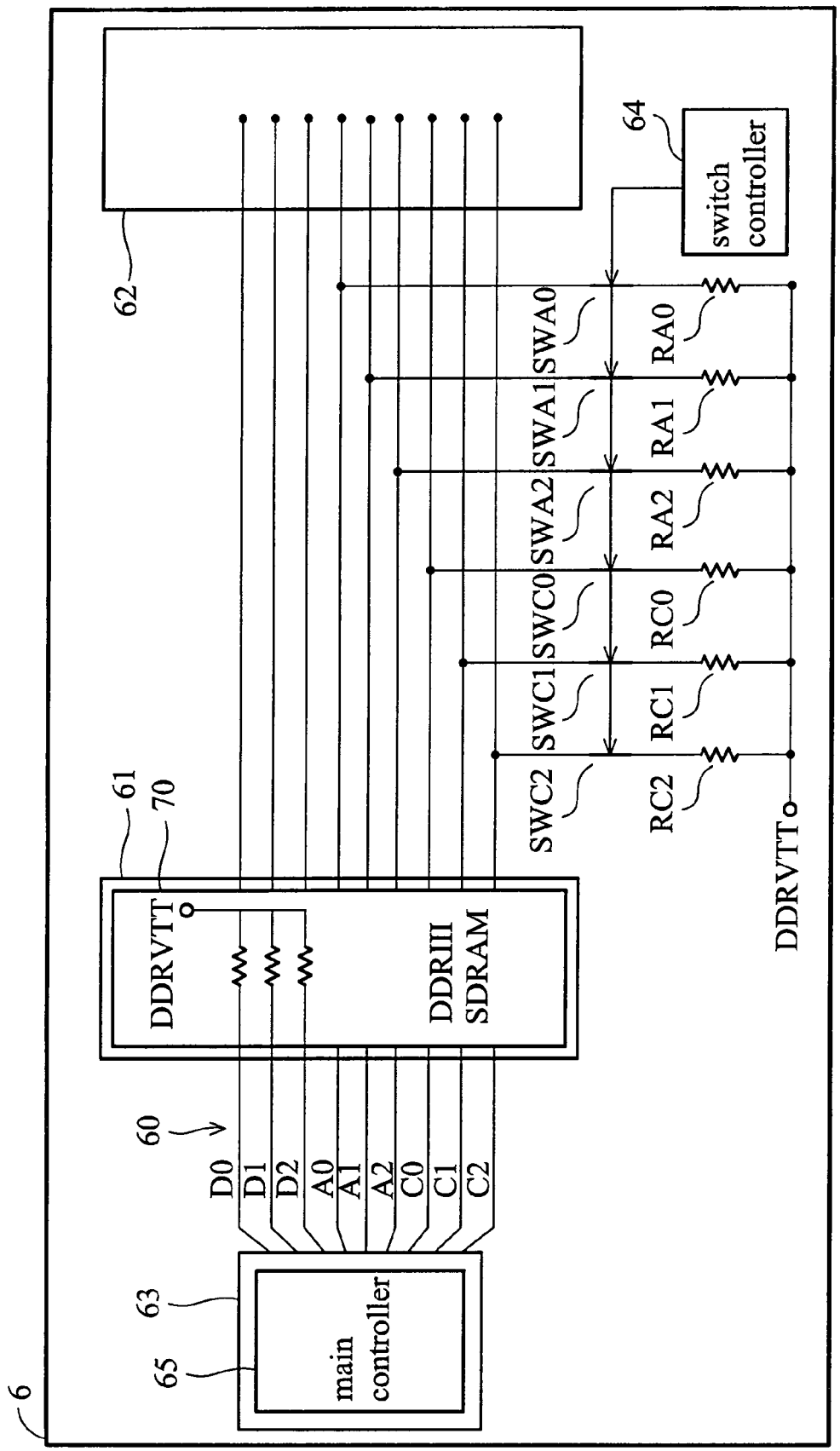
FIG. 7 shows the common module of FIG. 6a in the first mode.

FIG. 7 shows the common module 6 in the first mode. Referring to FIG. 7, in the first mode, a DDRII SDRAM 70 is installed in the first slot 61, and the switch controller 64 turns on the switches SWA0-SWA2 and SWC0-SWC2. The termination resistors RA0-RA2 and RC0-RC2 are correspondingly coupled to the first bus 60, thus, the termination resistors RA0-RA2 couple the address signals A0-A2, and the termination resistors RC0-RC2 coupled control signals C0-C2 respectively. Moreover, termination resistors matching the data signals D0-D2 are built into the DDRII SDRAM 70.

Figure 8:
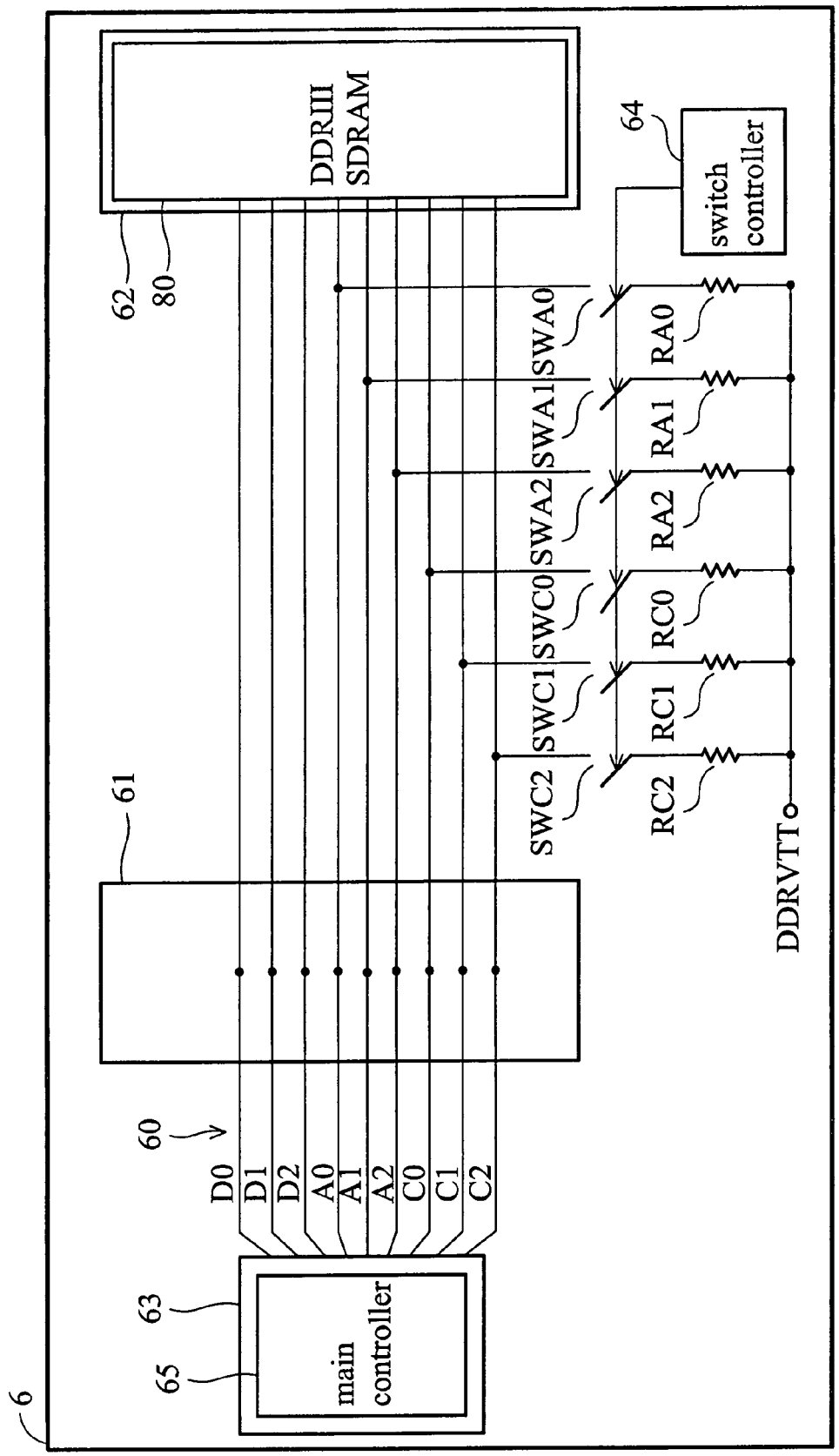
FIG. 8 shows the common module of FIG. 6a in the second mode.

FIG. 8 shows the common module 6 in the second mode. Referring to FIG. 8, in the second mode, the DDRII SDRAM 70 is removed from the first slot 61, and the DDRIII SDRAM 80 is installed in the second slot 62. The switch controller 64 turns off the switches SWA0-SWA2 and SWC0-SWC2. According to the specification of the DDRIII SDRAM 80, termination resistors for the data signals D0-D2, the address signals A0-A2, and the control signals C0-C2 are built into the DDRIII SDRAM 80, and the switches SWA0-SWA2 and SWC0-SWC2 34 are thus no longer coupled to the first bus 60.

According to the embodiment of FIGS. 6*a*-8, when the DDRII SDRAM 70 or the DDRIII SDRAM 80 is used, the switches SW between the termination resistors R and the first bus 61 are selectively turned on or off, thus, two main boards with different specifications are not required.

Moreover, in the embodiment of FIGS. 6*a*-8, one first slot 61 is given as an example. In practice the common module 6 may comprise a plurality of serially coupled first slots 61. In the first mode, one DDRII SDRAM is installed in one first slot 61.

Figure 9A:
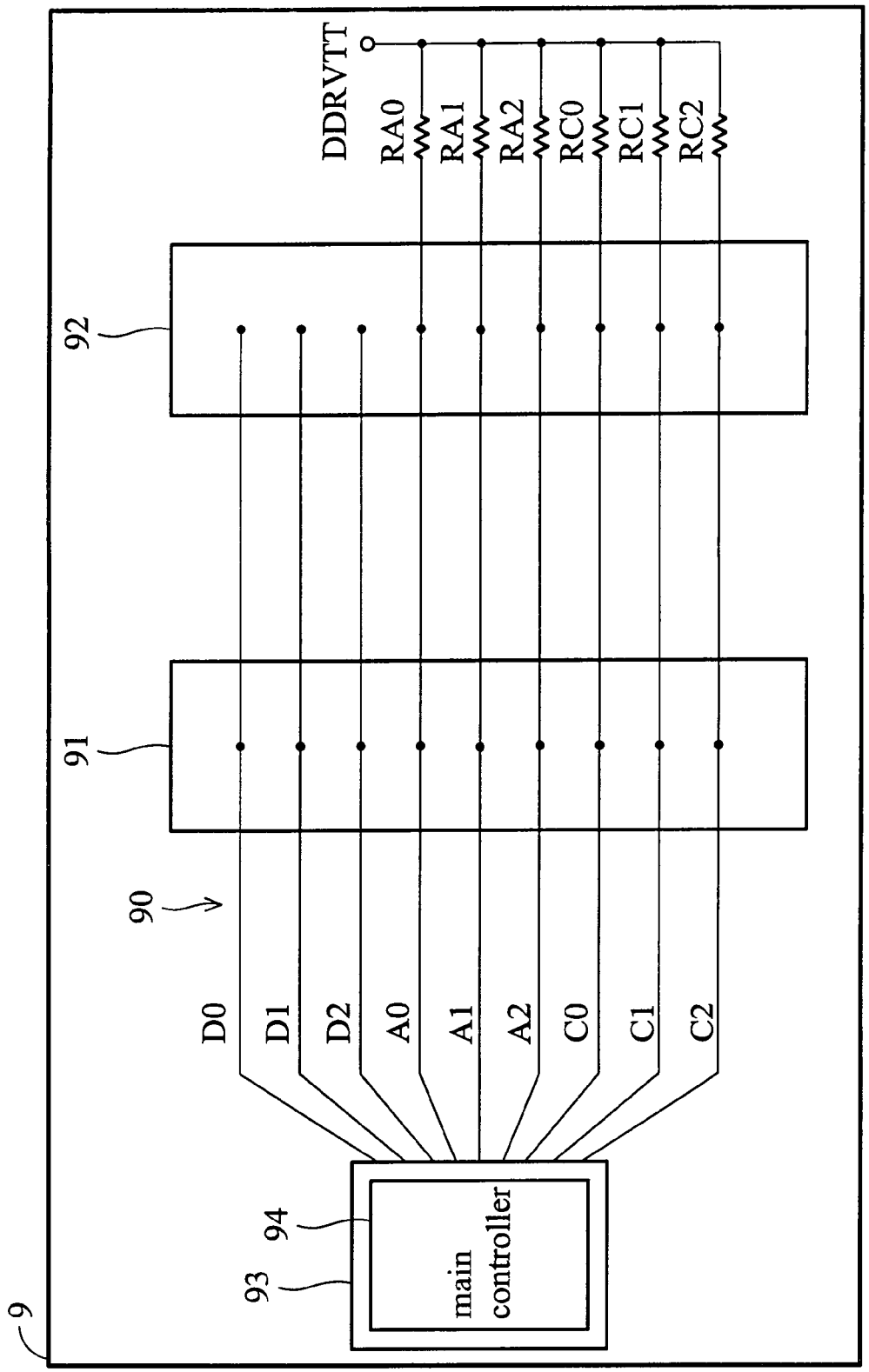
FIGS. 9a and 9b show an exemplary embodiment of a common module for a DDRII SDRAM and a DDRIII SDRAM.

In an exemplary embodiment of a common module for a DDRII SDRAM and a DDRIII SDRAM in FIG. 9*a*, a common module 9 is applied in a computer system and comprises a first bus 90, at least one first slot 91, a second slot 92, a third slot 93, and a plurality of termination resistors R. The first to third slots 91-93 are disposed on the common module 9 and coupled to the first bus 90. A main controller 94 of the computer system is installed in the third slot 93. The termination resistors R are correspondingly coupled to the first bus 90.

Figure 9B:
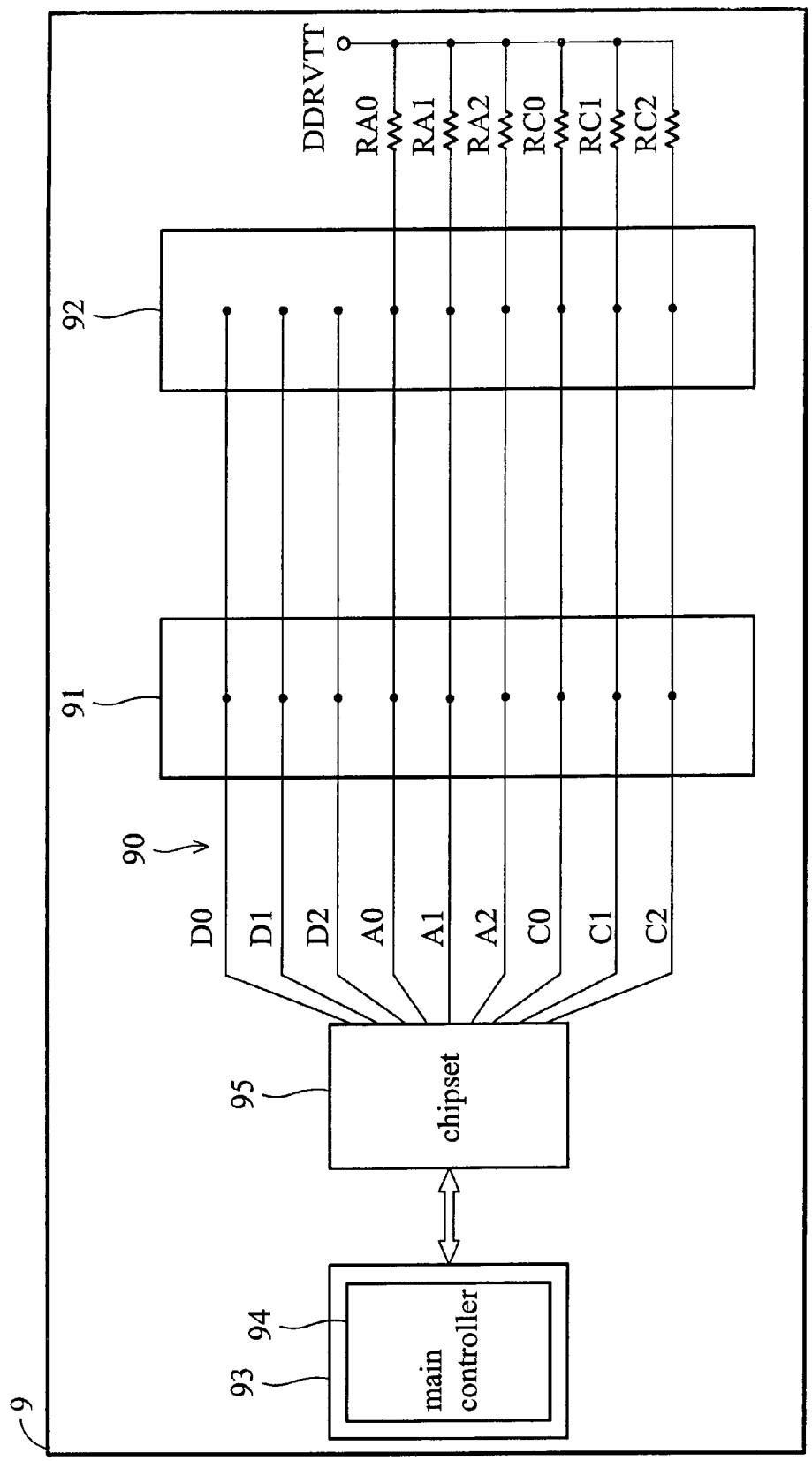

The main controller 94 provides a plurality of signals to the first bus 90. In some embodiments, the main controller 94 is an AMD CPU. In some embodiments, as shown in FIG. 9*b*, the common module 9 further comprises a chipset 95 coupled to the main controller 94, and the chipset 95 transmits signals from the main controller 94 to the first bus 90. In the embodiment of FIG. 9*b*, the main controller 94 is an Intel CPU, and the chipset 95 is implemented by a north bridge chipset.

The signals from the main controller 94 comprise data signals, address signals, and control signals. In the following description, data signals D0-D2, address signals A0-A2, and control signals C0-C2 are given as an example.

The termination resistors R are correspondingly coupled to the first bud 90 and match the data signals A0-A2 and the control signals C0-C2. For example, the termination resistors RA0-RA2 respectively match the address signals A0-A2, and the termination resistors RC0-RC2 respectively match the control signals C0-C2.

The common module 9 operates in two modes, the first is DDRII SDRAM mode, and the second is DDRIII SDRAM mode.

Figure 10:
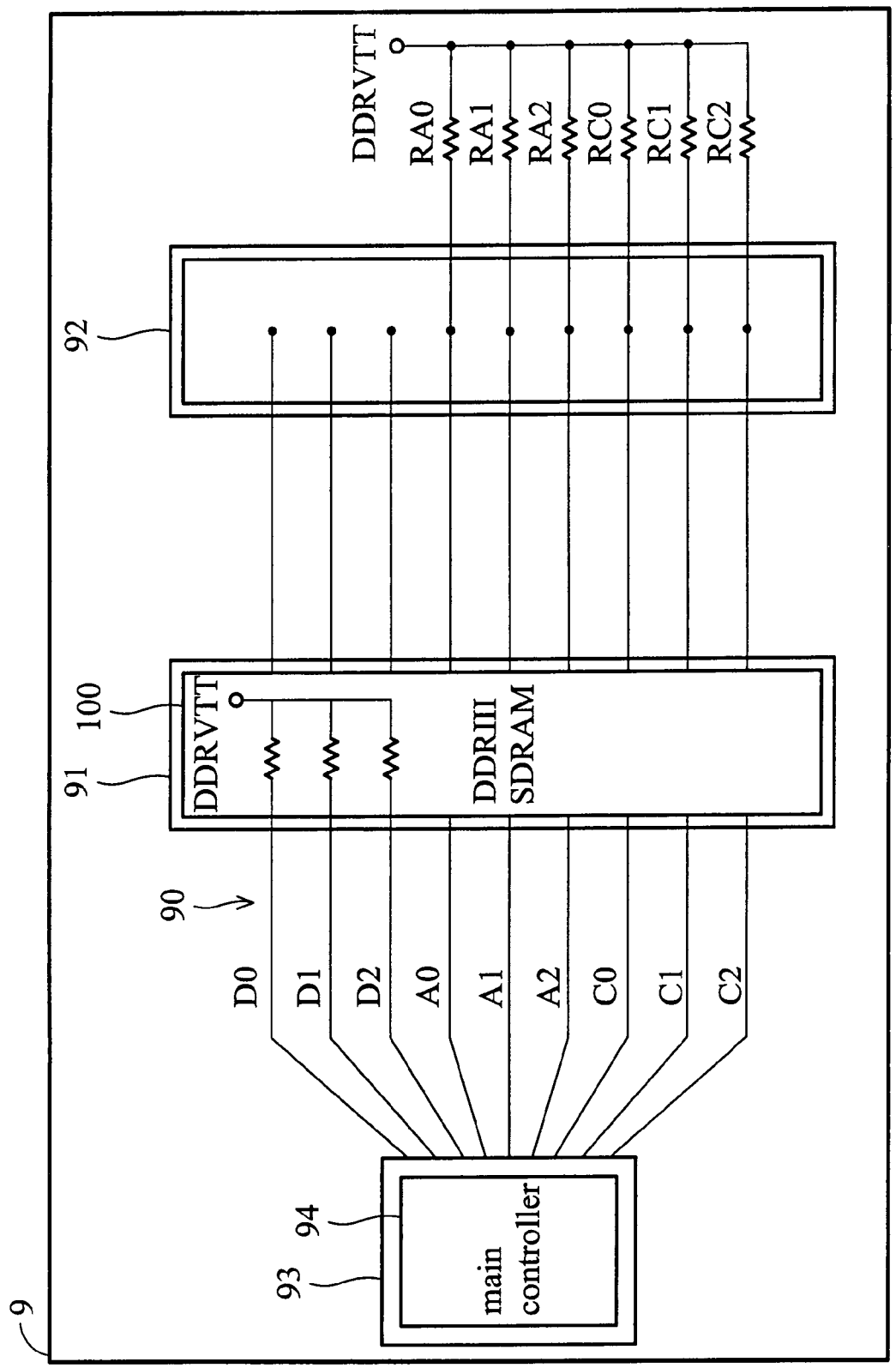
FIG. 10 shows the common module of FIG. 9a in the first mode.

FIG. 10 shows the common module 9 in the first mode. Referring to FIG. 10, in the first mode, a DDRII SDRAM 100 is installed in the first slot 91. Termination resistors matching the data signals D0-D2 are built into the DDRII SDRAM 100. Thus, the data signals D0-D2, the address signals A0-A2, and the control signals C0-C2 couple the matched termination resistors.

Figure 11:
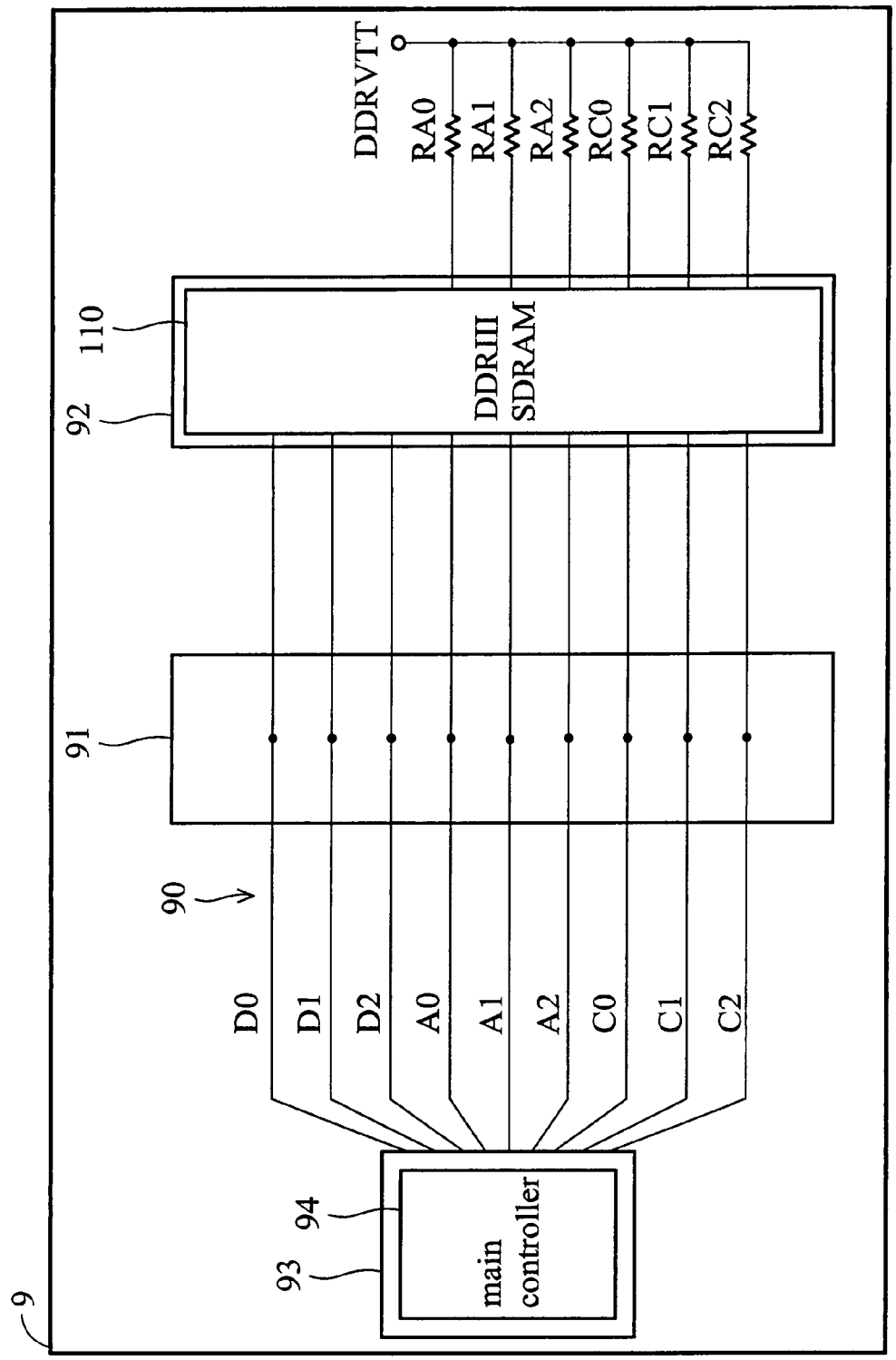
FIG. 11 shows the common module of FIG. 9a in the second mode.

FIG. 11 shows the common module 9 in the second mode. Referring to FIG. 11, in the second mode, the DDRII SDRAM 100 is removed from the first slot 91, and a DDRIII SDRAM 110 is installed in the second slot 92.

In some embodiments, a value of each termination resistor R is between 0 ohms and 100 ohm. In some embodiments, the value of each termination resistor R is between 10 ohms and 100 ohms.

According to the embodiment of FIGS. 9*a*-11, when the DDRII SDRAM 100 or the DDRIII SDRAM 110 is used, the DDRII SDRAM 100 or the DDRIII SDRAM 110 is selectively installed in the common module 9. Thus, the common module of the invention eliminates the need for two main boards with different specifications.

Additionally, in the embodiment of FIGS. 9*a*-11, one first slot 91 is given as an example. In practice, the common module 9 may comprise a plurality of serially coupled first slots 91. In the first mode, one DDRII SDRAM is installed in one first slot 91.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A common module for a double data rate-synchronous II synchronous dynamic random access memory (DDRII SDRAM) and a DDRIII SDRAM, applied in a computer, comprising:
    a first bus transmitting a plurality of signals;
    a termination circuit card comprising a plurality of termination resistors;
    a first slot disposed on the common module and coupled to the first bus, wherein the DDRII SDRAM is selectively installed in the first slot; and
    a second slot disposed on the common module and coupled to the first bus, wherein the DDRIII SDRAM or the termination circuit card is installed in the second slot;
    wherein when the DDRII SDRAM is installed in the first slot, the termination circuit card is installed in the second slot,
    wherein the signals comprise a plurality of data signals, a plurality of address signals, and a plurality of control signals, and the termination resistors comprise a plurality of first termination resistors and a plurality of second termination resistors, and
    wherein the first termination resistors match the address signals, and the second termination resistors match the control signals.

2. The common module as claimed in claim 1 further comprising a third slot disposed in the common module, wherein a main controller of the computer is installed in the third slot and provides the signals to the first bus.

3. The common module as claimed in claim 2 further comprising a chipset coupled to the main controller and transmitting the signals to the first bus.

4. The common module as claimed in claim 1, wherein the termination resistors are correspondingly coupled to the first bus.

5. A common module for a double data rate-synchronous II synchronous dynamic random access memory (DDRII SDRAM) and a DDRIII SDRAM, applied in a computer, and comprising:
    a first bus transmitting a plurality of signals;
    a first slot disposed on the common module and coupled to the first bus, wherein the DDRII SDRAM is installed in the first slot in a first mode;
    a second slot disposed on the common module and coupled to the first bus, wherein the DDRIII SDRAM is installed in the second slot in a second mode;
    a plurality of termination resistors; and
    a plurality of switches correspondingly coupled between the termination resistors and the first bus;
    wherein in the first mode, the switches are turned on to couple the termination resistors to the first bus,
    wherein in the second mode, the switches are turned off, wherein the signals comprise a plurality of data signals, a plurality of address signals, and a plurality of control signals, and the termination resistors comprise a plurality of first termination resistors and a plurality of second termination resistors, and wherein the first termination resistors match the address signals, and the second termination resistors match the control signals.

6. The common module as claimed in claim 5 further comprising a third slot disposed in the common module, wherein a main controller of the computer is installed in the third slot and provides the signals to the first bus.

7. The common module as claimed in claim 6 further comprising a chipset coupled to the main controller and transmitting the signals to the first bus.

8. A common module for a double data rate-synchronous II synchronous dynamic random access memory (DDRII SDRAM) and a DDRIII SDRAM, applied in a computer, and comprising:
- a first bus transmitting a plurality of signals;
- a first slot disposed on the common module and coupled to the first bus, wherein the DDRII SDRAM is selectively installed in the first slot;
- a second slot disposed on the common module and coupled to the first bus, wherein the DDRIII SDRAM is selectively installed in the second slot;
- a plurality of termination resistors correspondingly coupled the first bus, wherein the signals comprise a plurality of data signals, a plurality of address signals, and a plurality of control signals, and the termination resistors comprise a plurality of first termination resistors and a plurality of second termination resistors, and wherein the first termination resistors match the address signals, and the second termination resistors match the control signals.

9. The common module as claimed in claim 8 further comprising a third slot disposed in the common module, wherein a main controller of the computer is installed in the third slot and provides the signals to the first bus.

10. The common module as claimed in claim 9 further comprising a chipset coupled to the main controller and transmitting the signals to the first bus.

11. The common module as claimed in claim 8, wherein a value of each of the termination resistors is between 0 ohms and 100 ohms.

12. The common module as claimed in claim 11, wherein the value of each of the termination resistors is between 10 ohms and 100 ohms.

13. The common module as claimed in claim 8,
wherein in a first mode, the DDRII SDRAM is installed in the first slot, and
wherein in a second mode, the DDRII SDRAM is removed from the first slot, and the DDRIII SDRAM is installed in the second slot.

* * * * *